(12) United States Patent
Leussler et al.

(10) Patent No.: US 10,222,433 B2
(45) Date of Patent: Mar. 5, 2019

(54) RECEIVE COIL UNIT WITH INTEGRATED NOISE ANTENNAS AND MAGNETIC RESONANCE IMAGING SYSTEM WITH SUCH A RECEIVE COIL UNIT

(71) Applicant: KONINKLIJKE PHILIPS N.V., Eindhoven (NL)

(72) Inventors: Christoph Leussler, Eindhoven (NL); Daniel Wirtz, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/518,250

(22) PCT Filed: Oct. 16, 2015

(86) PCT No.: PCT/EP2015/073952
§ 371 (c)(1),
(2) Date: Apr. 11, 2017

(87) PCT Pub. No.: WO2016/059190
PCT Pub. Date: Apr. 21, 2016

(65) Prior Publication Data
US 2017/0307701 A1   Oct. 26, 2017

(30) Foreign Application Priority Data

Oct. 16, 2014  (EP) .................................. 14189261

(51) Int. Cl.
*G01R 33/36* (2006.01)
*G01R 33/3415* (2006.01)
(Continued)

(52) U.S. Cl.
CPC ......... *G01R 33/36* (2013.01); *G01R 33/3415* (2013.01); *G01R 33/422* (2013.01); *G01R 33/565* (2013.01); *G01R 33/5659* (2013.01)

(58) Field of Classification Search
CPC . G01R 33/36; G01R 33/3415; G01R 33/3685
(Continued)

(56) References Cited

U.S. PATENT DOCUMENTS

| 4,665,368 A | 5/1987 | Sugiyama et al. |
| 6,420,873 B1 | 7/2002 | Guthrie |

(Continued)

FOREIGN PATENT DOCUMENTS

WO    2014141109 A1    9/2014

*Primary Examiner* — Peguy Jean Pierre

(57) ABSTRACT

The present invention provides a receive coil unit (140) comprising a receive coil array (142) for use in a magnetic resonance imaging system (110) with multiple antenna units (144) sensitive to magnetic resonance signals, i.e. antenna units (144) sensitive to B-field signals, whereby each antenna unit (144) comprises a coil element (146) sensitive to B-field signals, and each antenna unit (144) comprises an E-field antenna (148) sensitive to E-field signals. The present invention also provides a magnetic resonance imaging system (110) comprising a receive coil unit (140) with a receive coil array (142) having multiple antenna units (144) sensitive to magnetic resonance signals, i.e. antenna units (144) sensitive to B-field signals, whereby the receive coil unit (140) is provided as a receive coil unit (140) as specified above. Still further, the present invention provides a method for magnetic resonance imaging comprising the steps of providing a receive coil unit (140) comprising a receive coil array (142) for use in a magnetic resonance imaging system (110) with multiple antenna units (144) sensitive to magnetic resonance signals, i.e. antenna units (144) sensitive to B-field signals, whereby each antenna unit (144) comprises a coil element (146) sensitive to B-field signals, and each antenna unit (144) comprises an E-field antenna (148) sensitive to E-field signals, and performing de-noising of the B-field signals received from the coil elements (146) of the (Continued)

receive coil unit (140) by filtering noise signals, as received from the E-field antenna (148), from the B-field signals.

19 Claims, 11 Drawing Sheets

(51) Int. Cl.
    *G01R 33/422*      (2006.01)
    *G01R 33/565*      (2006.01)

(58) Field of Classification Search
    USPC .......................................................... 343/787
    See application file for complete search history.

(56) References Cited

U.S. PATENT DOCUMENTS

| | | | |
|---|---|---|---|
| 6,424,154 | B1 | 7/2002 | Young |
| 9,213,072 | B2 * | 12/2015 | Taracila .............. G01R 33/3685 |
| 9,759,788 | B2 * | 9/2017 | Eberler .................. G01R 33/36 |
| 2008/0048658 | A1 | 2/2008 | Hushek |
| 2008/0315879 | A1 | 12/2008 | Saha |
| 2011/0109311 | A1 | 5/2011 | Walsh |
| 2014/0070810 | A1 | 3/2014 | Hector et al. |

\* cited by examiner

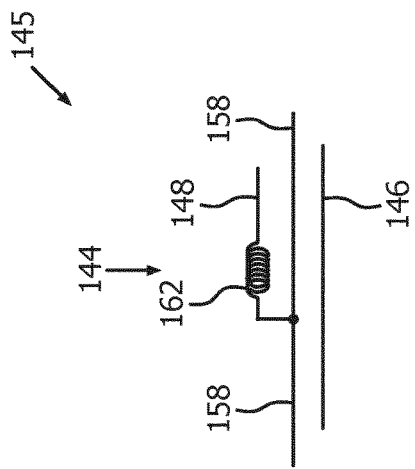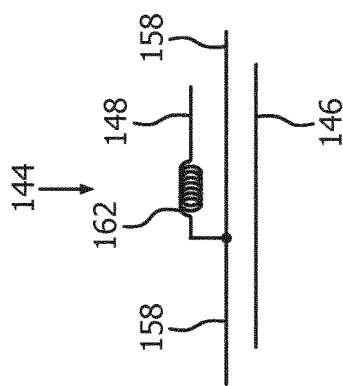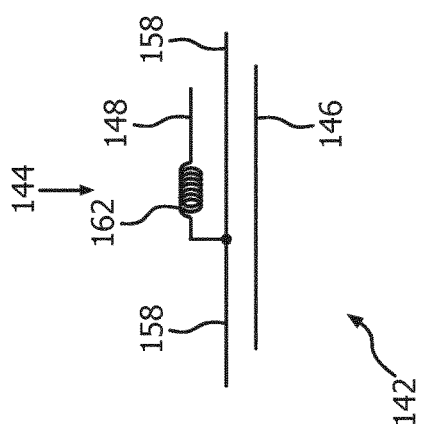
FIG. 6

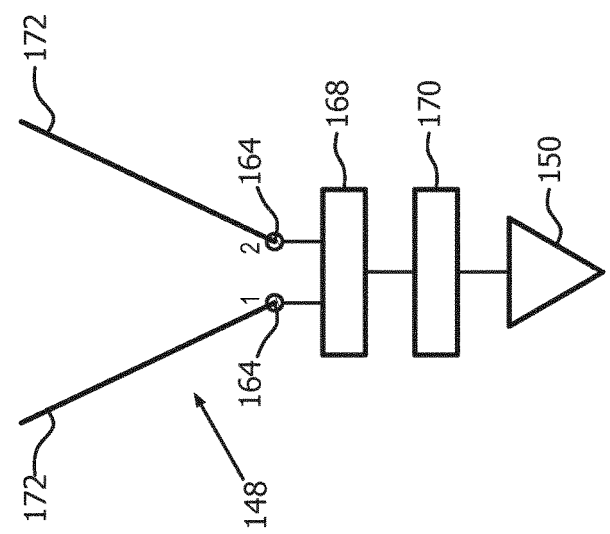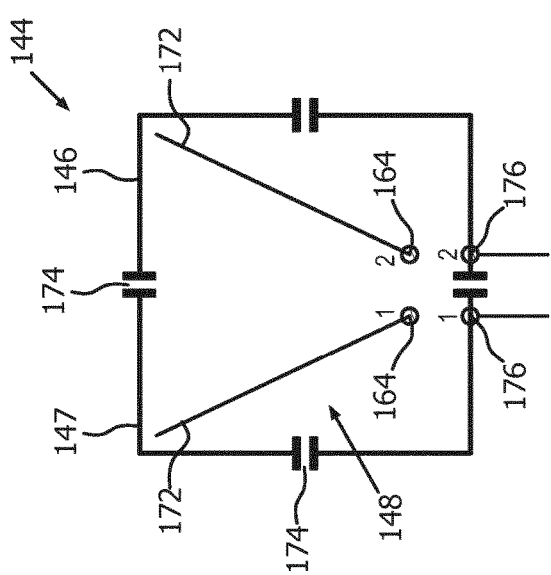
FIG. 8

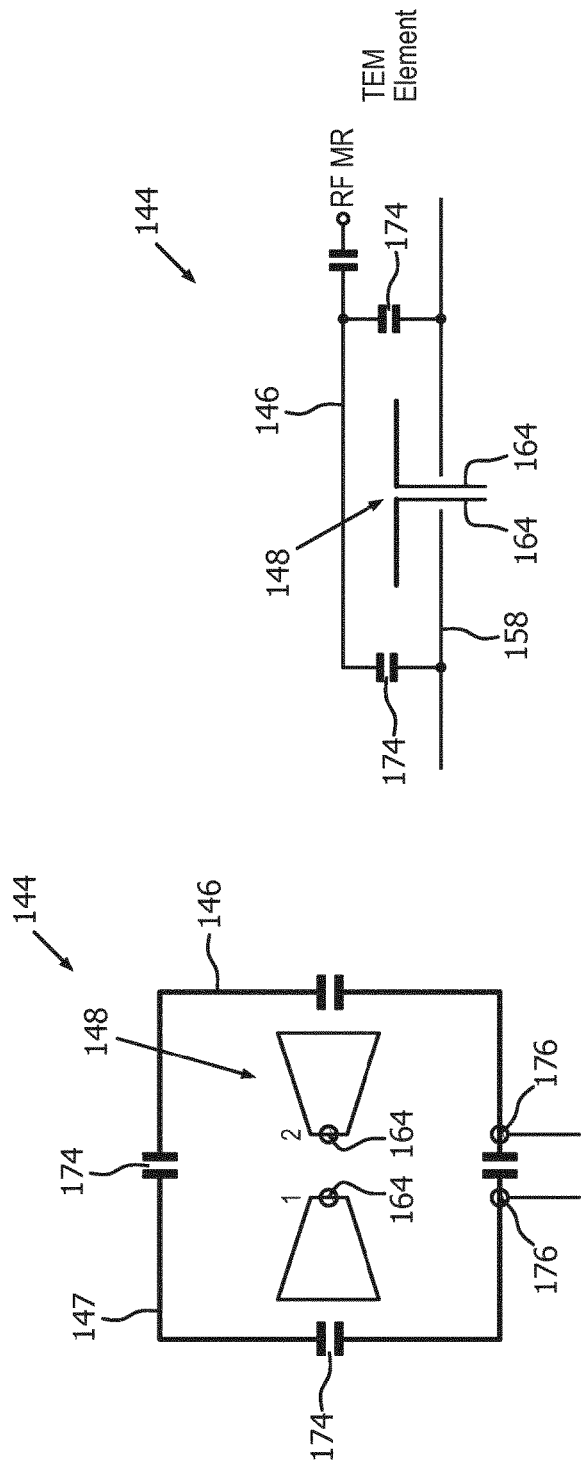

RECEIVE COIL UNIT WITH INTEGRATED NOISE ANTENNAS AND MAGNETIC RESONANCE IMAGING SYSTEM WITH SUCH A RECEIVE COIL UNIT

CROSS REFERENCE TO RELATED APPLICATIONS

This application is a U.S. national phase application of International Application No. PCT/EP2015/073952, filed on Oct. 16, 2015, which claims the benefit of EP Application Ser. No. 14189261.2 filed on Oct. 16, 2014 and is incorporated herein by reference.

FIELD OF THE INVENTION

The invention relates to the field of magnetic resonance imaging, in particular to the area of signal processing of magnetic resonance signals, i.e. B-field signals, received from a receive coil unit comprising a receive coil array with multiple antenna units sensitive to magnetic resonance signals.

BACKGROUND OF THE INVENTION

In the area of magnetic resonance (MR) imaging and magnetic resonance imaging systems, important improvements have been achieved in the recent years in respect the generation of diagnostic images based on MR imaging.

Nevertheless, to achieve reliable MR image generation, it is important to avoid disturbances of the MR signals received by the used receive coil unit comprising a receive coil array with multiple antenna units sensitive to magnetic resonance signals. Accordingly, in typical MR system set-ups, the walls of the magnet room have to be lined with RF-shielding metal grids or metal shields. This is predominantly done to avoid RF-radiation of various outside sources to enter a MR receive chain during signal reception while imaging, since the MR receive chain is very sensitive to the influence of noise. Moreover the RF-shielding confines the powerful RF-radiation during signal excitation to emerge and distract other RF-receivers such as aeronautical aircraft services. A fully equipped magnet room is thus complex to construct and costly.

A cageless MRI system needs to suppress the radiation resulting from the transmit antenna(s) during signal transmission and suppress the external noise and signal interference during receive. Without further means omitting the RF-shielding of the examination room renders the MRI system unusable.

SUMMARY OF THE INVENTION

It is an object of the invention to provide a receive coil unit comprising a receive coil array for use in a magnetic resonance imaging system with multiple antenna units sensitive to magnetic resonance signals, i.e. antenna units sensitive to B-field signals, a magnetic resonance imaging system comprising such a receive coil array and a method for operation of such a magnetic resonance imaging system, which enable a MR signal generation with reduced noise components and to provide an MR system which is less susceptible to RF noise.

In one aspect of the present invention, this object is achieved by a receive coil unit comprising a receive coil array for use in a magnetic resonance imaging system with multiple antenna units sensitive to magnetic resonance signals, i.e. antenna units sensitive to B-field signals, whereby each antenna unit comprises a coil element sensitive to B-field signals, and each antenna unit comprises an E-field antenna sensitive to E-field signals.

In another aspect of the present invention, this object is achieved by a magnetic resonance imaging system comprising a receive coil unit with a receive coil array having multiple antenna units sensitive to magnetic resonance signals, i.e. antenna units sensitive to B-field signals, whereby the receive coil unit is provided as an above receive coil unit.

In a further aspect of the present invention, this object is achieved by a method for magnetic resonance imaging comprising the steps of providing a receive coil unit comprising a receive coil array for use in a magnetic resonance imaging system with multiple antenna units sensitive to magnetic resonance signals, i.e. antenna units sensitive to B-field signals, whereby each antenna unit comprises a coil element sensitive to B-field signals, and each antenna unit comprises an E-field antenna sensitive to E-field signals, and performing de-noising of the B-field signals received from the coil elements of the receive coil unit by filtering noise signals, as received from the E-field antenna, from the B-field signals.

In a still further aspect of the present invention, this object is achieved by a software package for upgrading a MR imaging system, whereby the software package contains instructions for controlling the MR imaging system according to the above method.

Accordingly, noise signals can be obtained directly at the antenna units as a good indication of RF noise in the area of the coil elements. Hence, de-noising of the received MR signals, i.e. the B-field signals, can be easily performed based on the received E-field signals. The resulting vicinity of the coil element and the E-field antenna provides the noise signal directly at the place of the respective coil elements. Therefore, de-noising can be performed with high efficiency in a simple way. Furthermore, based on locally received E-field signals, noise interference from remote or local noise sources can be equally removed without further knowledge on the noise itself. This allows to provide MR imaging systems, where shielding requirements can be reduced, so that during a receive phase, no RF shielding or merely a reduced RF shielding is required compared to state of the Art MR imaging systems. Furthermore, de-noising can enable the operation of MR imaging systems in the context of clinical applications, where electric or electronic equipment like life support systems, therapy equipments or others are present, which are typical sources of RF noise and which are typically not usable within a shielded room, where the MR imaging system is located. Also in case where the RF shielding cannot be fully established, e.g. in case of an open RF screen or an open door of the shielded room, de-noising can enable generation of reliable MR signals with reduced noise based on the noise detection, i.e. detection of the E-filed signals using the E-field antenna, within the antenna units. This enables an efficient and compact local de-noising compared to remote noise pick up antennas, which are placed apart from the receive coil unit, e.g. outside a bore of the MR imaging system, e.g. all around the MR imaging system.

Since the B-field signals and the E-field signals are both provided from the antenna unit, existing MR imaging systems can easily be upgraded to implement de-noising of the MR signals. This requires merely replacing the conventional receive coil unit by the receive coil unit as specified above. As far as the operation of the MR imaging system has to be adapted, the software package for upgrading the MR imaging system can provide the required upgrade information, e.g. required code, to alter the MR imaging system as required to perform de-noising based on the E-field signals received from the E-field antennas of the respective coil elements.

The receive coil unit according to the present invention is not limited to a use as receive coil unit. Typically, coil units are provided as receive and transmit coils. Nevertheless, in the context of the present invention, only the operation as receive coil unit is discussed, since this operation is relevant.

As discussed above, each antenna unit has its own, local E-field antenna, which is sensitive to external RF noise. The external RF noise is identified by its E-field from the E-field antenna. For improved signal separation, E-field antenna and B-field antenna, i.e. the coil element, are decoupled.

Preferably, the E-field antenna's sensitivity for MR signal reception is strongly suppressed, preferably up to −80 dB.

For external noise, which is noise not resulting from the MR imaging system itself, the noise is not correlated. Therefore, the phase differences between the noise pick-up antenna, i.e. the E-field antenna, and the coil element of a respective antenna unit is fixed, even when the antenna unit is being moved inside the bore of the MR imaging system. Typically, the antenna units will be moved together, since the entire receive coil unit is moved. Nevertheless, no system calibration between the E-field antenna and the coil element of the respective antenna unit is required.

According to a preferred embodiment the receive coil unit comprises multiple de-noising units for filtering noise signals as received from the E-field antennas from the B-field signals received from the respective coil element, whereby one de-noising unit is associated to each antenna unit, and each de-noising unit is adapted to perform de-noising based on the E-field signals of the E-field antennas of the respective antenna unit. Hence, the number of de-noising units corresponds to the number of antenna units. In principal, it would also be possible to provide de-noising units only for some antenna units, which has the drawback of reduced signal quality for those antenna units not associated with a de-noising unit. The de-noising units are associated to the antenna units to enable an efficient signal processing of the signals received from the coil element and the E-field antenna. The de-noising units can be provided in general in any suitable location at or in the receive coil unit. Preferably, the antenna unit comprises the respective de-noising unit, so that an integral antenna unit can be provided. This reduces interferences occurring from signal transfer of the B-field signals of one antenna unit and the E-field signals of the E-field antenna. In an alternative embodiment, the de-noising units are provided commonly, preferably centrally, in the receive coil unit. Still further preferred, the de-noising units have an optical output for transmission of the filtered B-field signals from the antenna units to a control device of the MR imaging system. Hence, individual signals from the antenna units are digitized and processed locally in the antenna unit by a processor of the de-noising unit.

According to a preferred embodiment the receive coil unit comprises one de-noising unit for filtering noise signals as received from the E-field antenna from the B-field signals received from the respective coil element, whereby the de-noising unit is connected to multiple antenna units, and the de-noising unit is adapted to perform de-noising for each connected antenna unit based on the E-field signals of the E-field antennas of the connected antenna units. Hence, one de-noising unit receives the signals from all antenna units. In principal, it would also be possible to provide the de-noising unit only for some antenna units, which has the drawback of reduced signal quality for those antenna units not connected to the de-noising unit. The de-noising unit can be provided in general in any suitable location at or in the receive coil unit. Preferably, the de-noising unit is provided centrally in the receive coil unit. Still further preferred, the de-noising unit has an optical output for transmission of the filtered B-field signals from the antenna units to a control device of the MR imaging system. Furthermore, the de-noising unit can be adapted to perform a combined processing of data. Accordingly, the de-noising can be performed for the B-field signals of an antenna unit based on the E-field signals of the same antenna unit, or under additional consideration of E-field signals of further antenna units. Hence, de-noising of one channel, i.e. of the received B-field signals of one antenna unit, can be performed based on the E-field signals of the E-field antennas of multiple antenna units.

According to a preferred embodiment the magnetic resonance imaging system comprises a de-noising unit for filtering noise signals as received from the E-field antenna from the B-field signals received from the respective coil element, whereby the de-noising unit is connected to multiple antenna units of the receive coil unit, and the de-noising unit is adapted to perform de-noising for each connected antenna unit based on the E-field signals of the E-field antennas of the connected antenna units. Hence, the de-noising unit of the MR imaging system receives all signals from the receive coil unit, i.e. from all antenna units of the receive coil unit. In principal, it would also be possible to provide the de-noising unit only for some antenna units, which has the drawback of reduced signal quality for those antenna units not connected to the de-noising unit. The de-noising unit can be provided in general in any suitable location at or in the MR imaging system. Preferably, the de-noising unit is provided integrally with a control unit of the MR imaging system. Further preferred, the de-noising unit can be adapted to perform a combined processing of data. Accordingly, the de-noising can be performed for the B-field signals of an antenna unit based on the E-field signals of the same antenna unit, or under additional consideration of E-field signals of further antenna units. Hence, de-noising of one channel, i.e. of the received B-field signals of one antenna unit, can be performed based on the E-field signals of the E-field antennas of multiple antenna units.

In each of the above cases, the de-noising unit is preferably adapted to perform a de-noising as specified below in detail. De-noising can be done separately in time, frequency or image domain. Further preferred, de-noising is realized using a local database. To de-noise an image, certain patterns have to be trained beforehand, e.g. using typical noise sources or signals. The individual signals are digitized and processed by a processor of the de-noising unit. A software algorithm may calculate e.g. a de-noised image.

According to a preferred embodiment the de-noising unit is adapted to perform de-noising based on antiphase operation and/or based on an independent component analysis. This operation for de-noising has been proven suitable and efficient in terms of noise reduction. In antiphase operation, to cancel e.g. locally generated interferences, an interfering signal is detected and an antiphase signal is generated, whereby the antiphase signal is adjusted in its phase and magnitude, so that it matches the unwanted signal interference in the digital domain, i.e. the locally generated interferences, but it is 180 degrees out of phase, effectively cancelling the interference. Independent Component Analysis, also referred to as ICA, is a statistical technique for decomposing a complex dataset into independent sub-parts, which can then be utilized to determine noise compounds of the signal and cancel it by adding an inverted signal of equal amplitude. Antiphase operation and independent component analysis are as such known to a person skilled in the Art, so that no further details are provided in respect to the implementation.

According to a preferred embodiment at least one analog-to-digital converter is provided for converting analog signals from the antenna unit into digital signals fed to the de-noising unit. The analog-to-digital converter enables a digital processing of signal data. Digital signals are especially under consideration of MR environments with high magnetic field strengths and additional RF fields applied more reliable than analog signals. Further preferred, the digital signals are converted into optical signals. Optical signals are not affected by the high magnetic field strengths and the applied RF fields. Furthermore, transmission of optical signals can be performed without generation of additional RF-noise from the otherwise electric signal transmission. The analog to digital converter can be provided as a single converter for converting the signals of all antenna units. Alternatively, each antenna unit may comprise one converter, still further preferred each antenna unit may comprise one converter for signals from the coil element and one converter for signals from the E-field antenna. Hence, the analog to digital converters are provided as single channel converters. Accordingly, the antenna units can be provided with an integrated design.

According to a preferred embodiment the E-field antenna is embedded in the coil element for each antenna unit. The term "embedded" here refers to a placement of the E-field antenna in vicinity of the coil element, so that the E-field antenna can reliably provide E-field signals as indication for noise at the respective coil element. For external noise, i.e. noise not generated from the MR imaging system itself, a fixed phase relationship is established between the coil element and the E-field antenna for each antenna unit. Hence, independently from the placement of the receive coil unit in a bore of the MR imaging system, a calibration is not required.

According to a preferred embodiment the coil element is provided as an essentially planar loop and the E-field antenna is preferably located in the plane of the coil element as defined by the planar loop. This is achievable, e.g. by using a dipole type of E-field antenna, which is intrinsically decoupled from the coil element. Nevertheless, the E-field antenna may also be oriented at some angle with respect to the coil element. Preferably, a midpoint of the E-field antenna is located within the plane of the coil element. The orientation of the E-field antenna is preferably chosen such that it can pick up most of incident E-fields. Therefore a design which can detect circularly or elliptically polarized E-fields will be advantageous. Further preferred, the E-field antenna is located within the coil element. The planar loop may additionally comprise coupling elements. Providing the coil element as a planar loop comprises that the planar loop may extended along a surface of the receive coil unit. Hence, the planar loop may refer to an extension along a circumferential surface of the receive coil unit.

In an alternative embodiment, the E-field antenna is located out of the plane of the planar loop. Preferably, the E-field antenna located radially outward of the plane of the planar loop. Preferably, the E-field antenna is located within.

According to a preferred embodiment the E-field antenna of each antenna unit is connected via at least one of a diversity switch, a balun, an impedance matching unit or a pre-amplifier to the respective de-noising unit. The integration of additional electronic components into the receive coil unit or, preferably, into the respective antenna unit facilitates the design of the receive coil unit and the MR imaging system comprising the receive coil unit. In particular, the use of electric cables in the MR imaging system is preferably avoided due to radiation thereof in operation. Hence, it is preferred to provide the receive coil unit or already the antenna units with digital outputs, further preferred with optical outputs, which can easily be connected to e.g. a control unit of the MR imaging system.

According to a preferred embodiment the antenna unit comprises local RF screen, and the E-field antennas of the antenna units are connected to the local RF screen. In particular, the E-field antennas can be provided in a direction radially inward or outward of the local RF screen, whereas the coil elements are located in a direction radially inward of the local RF screen. This placement of the E-field antennas facilitates the design of the receive coil units. The coil elements can be provided individually from the E-field antennas, so that e.g. existing receive coil units can be easily re-designed or modified according to the present invention by adding the E-field antennas together with the local RF screen. When the E-field antennas are provided in a direction radially outward of the local RF screen the E-field signals indicating the noise can be detected on the outside of the local RF screen. Since the RF-screen shields the antenna units, noise detection on the outside of the local RF screen may be sufficient to enable reliable de-noising. Furthermore, the placement of the E-field antennas radially outside of the local RF screen can be easily realized due to reduced coupling of the E-field antennas with the coil elements.

In an alternative embodiment, the E-field antennas are located on or behind the covers of the bore of the MR imaging system. This placement provides a constructional separation of the coil element and the E-filed antenna. Nevertheless, depending on the receive coil unit placed in the bore, the E-field antennas and the coil elements can be aligned in a way that coil element and the E-field antenna form a distributed antenna unit, whereby the E-field antennas are placed as required in respect to the coil elements to enable a reliable reception of E-field signals as indication for noise locally at each coil element. Accordingly, a modification of the coil elements and therefore of the antenna units and the receive coil unit as a whole, is not required. This is applicable in particular for surface coils used for large patients, where the outer circumferential surface of the receive coil unit is provided vis-à-vis to an internal circumferential surface of the bore. Hence, there is a small distance between the outer circumferential surface of the receive coil unit and the internal circumferential surface of the bore.

According to a preferred embodiment the E-field antenna is provided as a dipolar, stripline, or helical pick-up antenna. These types of E-field antennas enable a good reception of the E-field signals as an indication of noise. At the same time, these types of E-field antennas have a low sensitivity for MR signals, i.e. B-field signals. Hence, the E-field antennas' sensitivity for MR signal reception can be strongly suppressed, typically up to −80 dB, by antenna design using the dipolar, stripline or helical noise pick up antennas.

According to a preferred embodiment the E-field antenna is provided as an active noise pick-up antenna. The active noise pick-up antenna is based on a monopole structure associated to a transistor. Preferably, the active noise pick-up antenna is circularly polarized.

According to a preferred embodiment the receive coil unit comprises an RF screen, which is provided as a circumferential screen in the receive coil unit or as a circumferential outer surface thereof, the coil element is provided as a TEM coil element, which is coupled to the RF screen, and the coil element, the E-field antenna and the RF screen are arranged in this order in a direction radially outward of the receive coil unit. Hence, also TEM coil elements can be used as coil elements of the receive coil unit. No general limitations in respect to used coil types apply.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings:

FIG. 6 is a detailed schematic illustration of a receive coil unit of the MR imaging system of FIG. 1 according to a fifth embodiment, FIG. 8 is a schematic illustration of an antenna unit of any of the above receive coil units according to a seventh embodiment, FIG. 9 is a schematic illustration of an antenna unit according to an eights embodiment, FIG. 10 is a schematic illustration of an antenna unit according to a ninth embodiment.

DETAILED DESCRIPTION OF EMBODIMENTS

Figure 1:
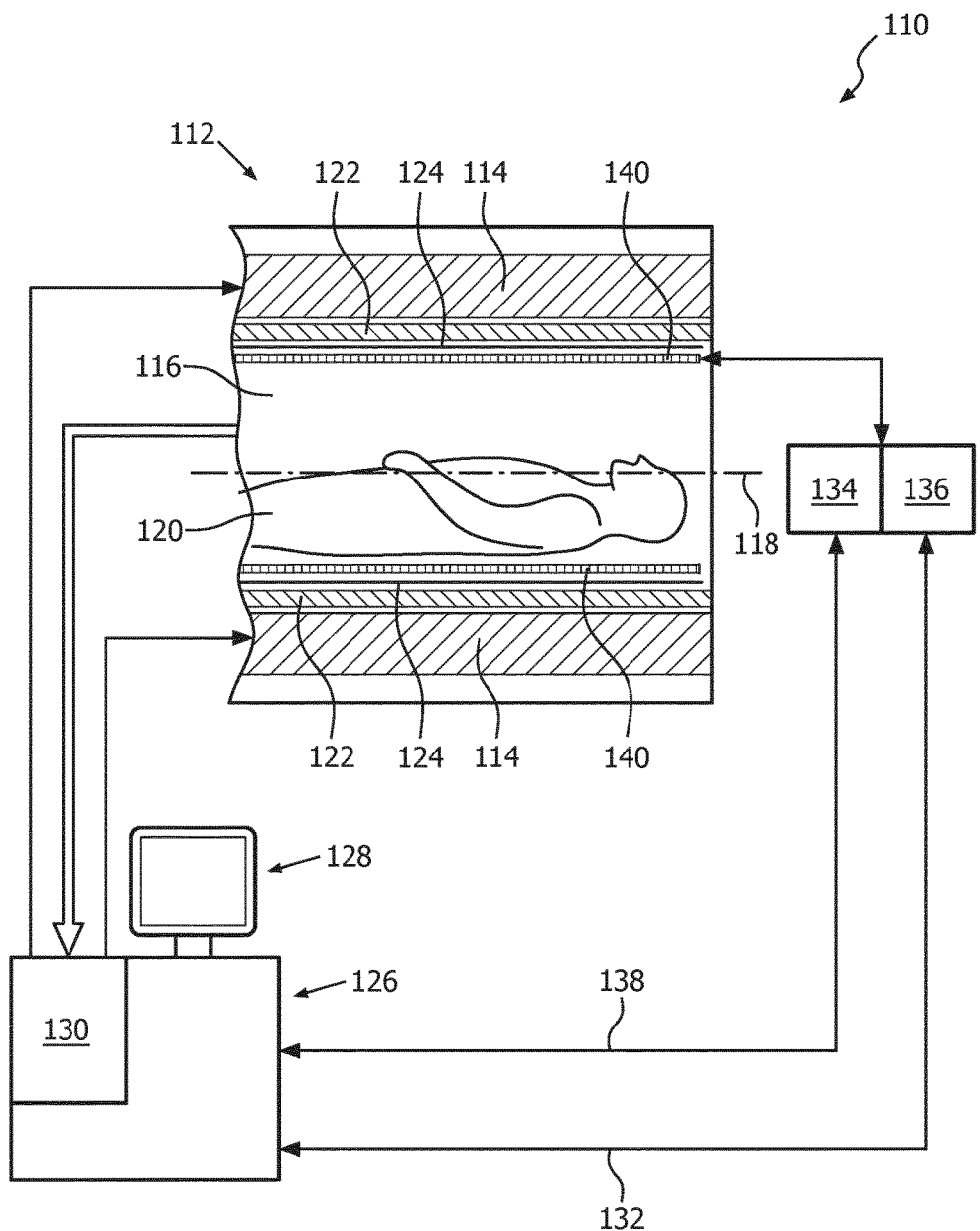
FIG. 1 is a schematic illustration of a part of an embodiment of a magnetic resonance (MR) imaging system in accordance with the invention.

FIG. 1 shows a schematic illustration of a part of an embodiment of a magnetic resonance (MR) imaging system 110 comprising an MR scanner 112. The MR imaging system 110 includes a main magnet 114 provided for generating a static magnetic field. The main magnet 114 has a central bore that provides an examination space 116 around a center axis 118 for a subject of interest 120, usually a patient, to be positioned within. In this embodiment, the central bore and therefore the static magnetic field of the main magnet 114 have a horizontal orientation in accordance with the center axis 118. In an alternative embodiment, the orientation of the main magnet 114 can be different, e.g. to provide the static magnetic field with a vertical orientation. Further, the MR imaging system 110 comprises a magnetic gradient coil system 122 provided for generating gradient magnetic fields superimposed to the static magnetic field. The magnetic gradient coil system 122 is concentrically arranged within the bore of the main magnet 114, as known in the art.

Further, the MR imaging system 110 includes a radio frequency (RF) antenna device 140 designed as a whole-body coil having a tubular body. In an alternative embodiment, the RF antenna device 140 is designed as a head coil or any other suitable coil type for use in MR imaging systems 110. The RF antenna device 140 is provided for applying an RF magnetic field to the examination space 116 during RF transmit phases to excite nuclei of the subject of interest 120, which shall be covered by MR images. The RF antenna device 140 is also provided to receive MR signals from the excited nuclei during RF receive phases. In a state of operation of the MR imaging system 110, RF transmit phases and RF receive phases are taking place in a consecutive manner. The RF antenna device 140 is arranged concentrically within the bore of the main magnet 114. As is known in the art, a cylindrical metal RF screen 124 is arranged concentrically between the magnetic gradient coil system 122 and the RF antenna device 140.

In the context of the present invention, the RF antenna device 140 is discussed in respect to its receiving capabilities, Hence, the RF antenna device 140 is also referred to as receive coil unit 140.

Moreover, the MR imaging system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 132 are installed between the MR imaging system control unit 126 and an RF transmitter unit 134 that is provided to feed RF power of an MR radio frequency to the RF antenna device 140 via an RF switching unit 136 during the RF transmit phases. The RF switching unit 136 in turn is also controlled by the MR imaging system control unit 126, and another control line 138 is installed between the MR imaging system control unit 126 and the RF switching unit 136 to serve that purpose. During RF receive phase, the RF switching unit 136 directs the MR signals from the RF antenna device 140 to the MR image reconstruction unit 130 after pre-amplification.

Figure 2:
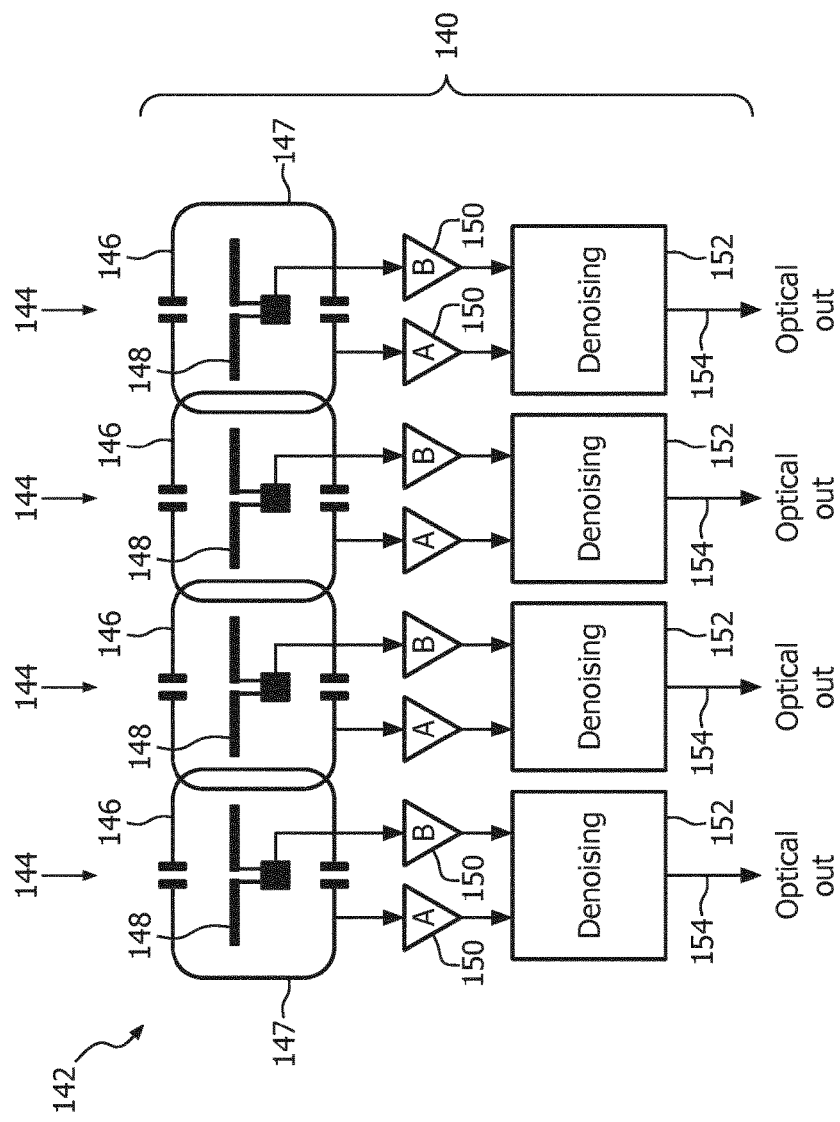
FIG. 2 is a schematic illustration of a receive coil unit of the MR imaging system of FIG. 1 according to a first, preferred embodiment.

A receive coil unit 140 according to a first, preferred embodiment is shown in FIG. 2. The receive coil unit 140 comprises a receive coil array 142 for use in magnetic resonance imaging systems 110. The receive coil array 142 comprises multiple antenna units 144, which comprise a coil element 146 sensitive to magnetic resonance signals, i.e. sensitive to B-field signals, and an E-field antenna 148 sensitive to E-field signals. The E-field antenna 148 and the coil element 146 are decoupled, whereby the E-field antenna's 148 sensitivity for MR signal reception is strongly suppressed, in this embodiment up to −80 dB.

As can be seen in FIG. 2, the coil element 146 is provided as an essentially planar loop 147, and the E-field antenna 148 is embedded in the coil element 146 for each antenna unit 144. As can be further seen in FIG. 2, the E-field antenna 148 is located in the plane of the coil element 146 and within the coil element 146. In an alternative embodiment, the E-field antenna 148 is oriented at some angle with respect to the coil element 146. Providing the coil element 146 as a planar loop 147 comprises that the planar loop 147 may extended along an surface of the receive coil unit 140.

Accordingly, the E-field antenna 148 is embedded in the coil element 146 for each antenna unit 144.

The antenna units 144 further comprise pre-amplifiers 150, which are connected with their inputs to the coil element 146 and the E-field antenna 148. The antenna units 144 comprise each a de-noising unit 152 for filtering noise signals as received from the E-field antennas 148 from the B-field signals received from the respective coil element 146. Each de-noising unit 152 is adapted to perform de-noising based on the E-field signals of the E-field antennas 148 of the respective antenna unit 144. Accordingly, the de-noising units 152 receive as input signals the pre-amplified signals from the coil element 146 and the E-field antenna 148 of each antenna unit 144 via the pre-amplifiers 150. As can be further seen in FIG. 2, the de-noising units 152 have an optical output 154 for transmission of the filtered B-field signals from the antenna units 144 to the control unit 126 of the MR imaging system 110.

The de-noising unit of the first embodiment is adapted to perform de-noising based on antiphase operation to cancel e.g. locally generated interferences. In antiphase operation, an interfering signal is detected and an antiphase signal is generated, whereby the antiphase signal is adjusted in its phase and magnitude, so that it matches the unwanted signal interference in the digital domain, i.e. the locally generated interferences, but it is 180 degrees out of phase, effectively cancelling the interference. In an alternative embodiment, the de-noising unit is adapted to perform de-noising based on an independent component analysis. Independent Component Analysis, also referred to as ICA, is a statistical technique for decomposing a complex dataset into independent sub-parts, which can then be utilized to determine noise compounds of the signal and cancel it by adding an inverted signal of equal amplitude.

Figure 3:
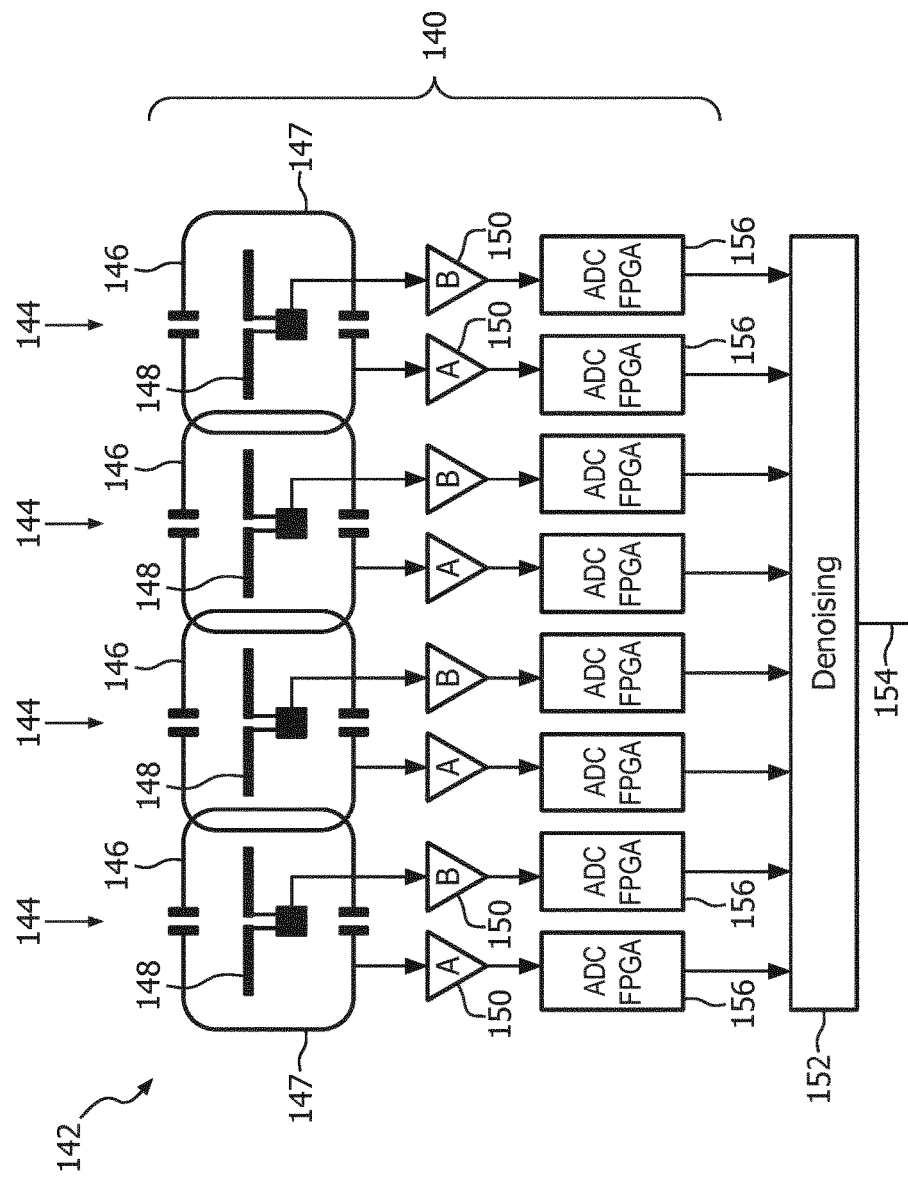
FIG. 3 is a schematic illustration of a receive coil unit of the MR imaging system of FIG. 1 according to a second embodiment.

A receive coil unit 140 according to a second embodiment is shown in FIG. 3. The receive coil unit 140 of the second embodiment is in major aspects identical to the receive coil unit 140 of the first embodiment. If not otherwise stated, principles of the receive coil unit 140 of the first embodiment also apply to the receive coil unit 140 of the second embodiment.

The receive coil unit 140 of the second embodiment comprises a receive coil array 142 with multiple antenna units 144. The antenna units 144 each comprise a coil element 146 sensitive to magnetic resonance signals, i.e. B-field signals, and an E-field antenna 148 sensitive to E-field signals. The antenna units 144 further comprise pre-amplifiers 150, which are connected with their inputs to the coil element 146 and the E-field antenna 148. Furthermore, each pre-amplifier 150 is connected to an analog-to-digital converter 156, also referred to as ADC. The ADC 156 comprises a FPGA and performs a conversion of the pre-amplified signals of the coil elements 146 and the E-field antennas 148 into digital signals. Furthermore, the digital signals are provided as optical signals from the ADCs 156.

According to the second embodiment, the receive coil unit 140 comprises a de-noising unit 152 for filtering noise signals as received from the E-field antennas 148 from the B-field signals received from the respective coil element 146. The de-noising unit 152 is provided centrally in the receive coil unit 140. The de-noising unit 152 is adapted to perform de-noising based on the E-field signals of the E-field antennas 148 of the respective antenna unit 144. Accordingly, the de-noising unit 152 receive as input signals the pre-amplified signals from the coil elements 146 and the E-field antennas 148 of all antenna units 144 via the pre-amplifiers 150. As can be further seen in FIG. 3, the de-noising unit 152 has an optical output 154 for transmission of the filtered B-field signals from the receive unit 140 to the control unit 126 of the MR imaging system 110.

In an alternative embodiment, the de-noising unit 152 is adapted to perform a combined processing of data. Accordingly, the de-noising is performed in the de-noising unit 152 for the B-field signals of an antenna unit 144 based on the E-field signals of the same antenna unit 144 and under additional consideration of E-field signals of further antenna units 144.

Figure 4:
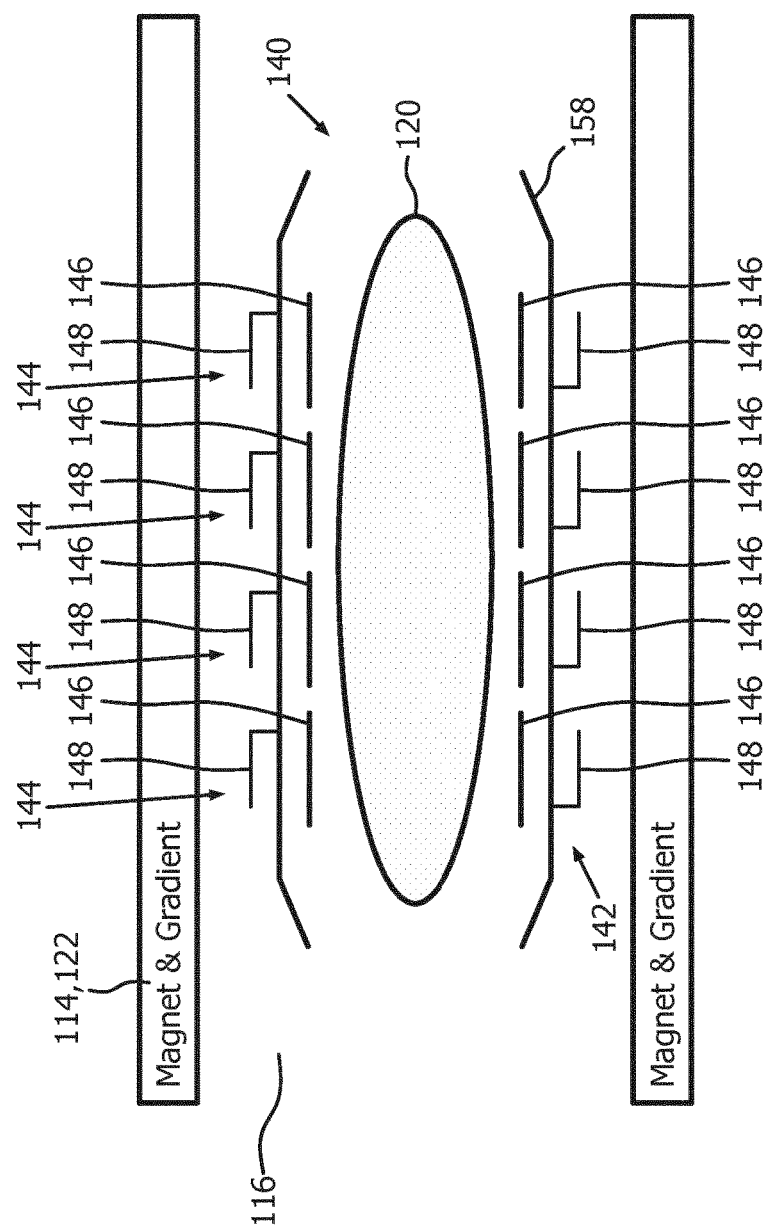
FIG. 4 is a schematic illustration of a receive coil unit of the MR imaging system of FIG. 1 according to a third embodiment in a sectional side view within a bore of the MR imaging system of FIG. 1.

A receive coil unit 140 according to a third embodiment is shown in FIG. 4. The receive coil unit 140 of the third embodiment is in major aspects identical to the receive coil unit 140 of the first embodiment. If not otherwise stated, principles of the receive coil unit 140 of the first embodiment also apply to the receive coil unit 140 of the third embodiment.

The receive coil unit 140 of the third embodiment is shown within the examination space 116 of the MR imaging system 110. The examination space 116 is also referred to as bore. The examination space 116 is limited by the main magnet 114 and the magnetic gradient coil system 122.

The receive coil unit 140 of the third embodiment comprises a receive coil array 142 with multiple antenna units 144. The antenna units 144 each comprise a coil element 146 sensitive to magnetic resonance signals, i.e. B-field signals, and an E-field antenna 148 sensitive to E-field signals. As can be seen in FIG. 4, the receive coil unit 140 comprises a local RF screen 158, and the E-field antennas 148 are connected to the local RF screen 158. In particular, the E-field antennas 148 located in a direction radially outward of the local RF screen 158, whereas the coil elements 146 are located in a direction radially inward of the local RF screen 158. The local RF screen 158 in this embodiment is provided as a circumferential screen in the receive coil unit.

According to the third embodiment, the antenna units 144 further comprise pre-amplifiers 150 in accordance with the receive coil unit of the first embodiment. Hence, the pre-amplifiers 150 are connected with their inputs to the coil element 146 and the E-field antenna 148. Furthermore, each antenna unit 144 comprises a de-noising unit 152, as described with reference to the first embodiment.

Figure 5:
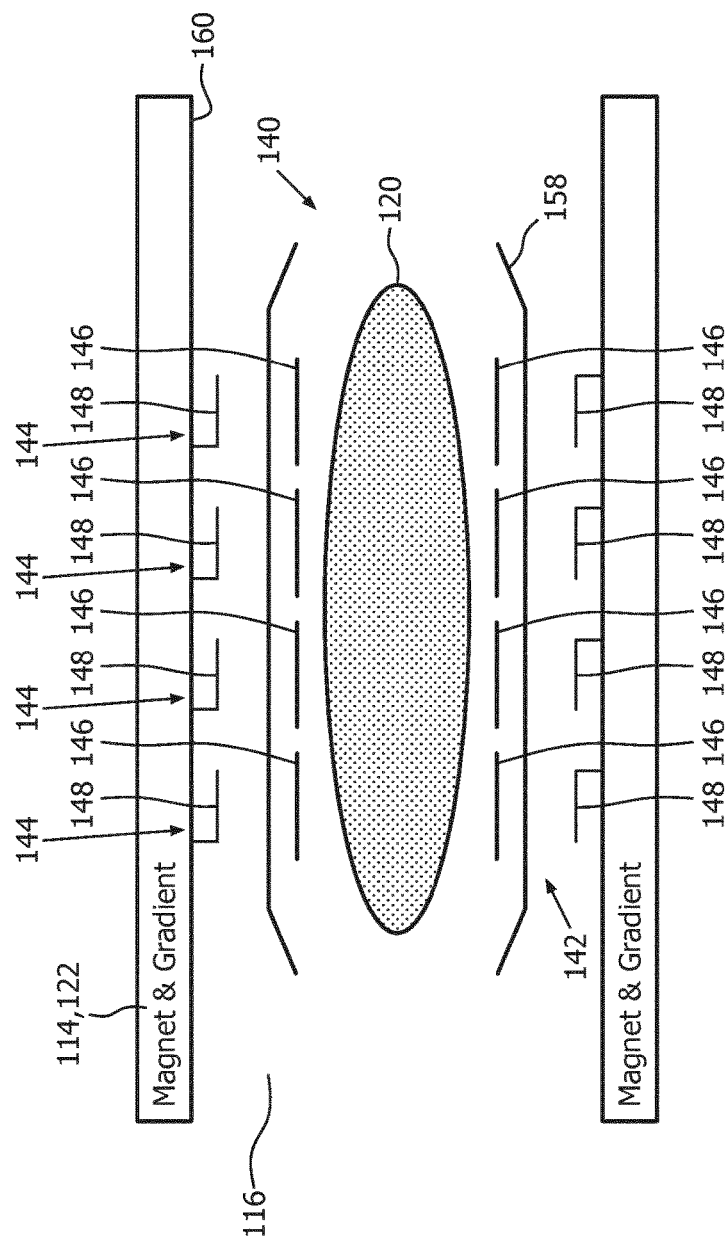
FIG. 5 is a schematic illustration of a receive coil unit of the MR imaging system of FIG. 1 according to a fourth embodiment in a sectional side view within a bore of the MR imaging system of FIG. 1.

A receive coil unit 140 according to a fourth embodiment is shown in FIG. 5. The receive coil unit 140 of the fourth embodiment is in major aspects identical to the receive coil unit 140 of the first embodiment. If not otherwise stated, principles of the receive coil unit 140 of the first embodiment also apply to the receive coil unit 140 of the fourth embodiment.

The receive coil unit 140 of the fourth embodiment is shown within the examination space 116 of the MR imaging system 110. The examination space 116 is limited by the main magnet 114 and the magnetic gradient coil system 122.

The receive coil unit 140 of the fourth embodiment comprises a receive coil array 142 with multiple antenna units 144. The antenna units 144 each comprise a coil element 146 sensitive to magnetic resonance signals, i.e. B-field signals, and an E-field antenna 148 sensitive to E-field signals. The receive coil unit 140 comprises a local RF screen 158 in accordance with the third embodiment. As can be seen in FIG. 5, the E-field antennas 148 are connected to a circumferential cover 160 of the bore 116 of the MR imaging system 110, thereby providing a constructional separation of the coil element 146 and the E-filed antenna 148. With the receive coil unit 140 placed in the bore 116 in a specified way, the E-field antennas 148 and the coil elements 146 are aligned so that a coil element 146 and corresponding E-field antenna 148 form a distributed antenna unit 144.

A receive coil unit 140 according to a fifth embodiment is shown in FIG. 6. The receive coil unit 140 of the fifth embodiment is in major aspects identical to the receive coil unit 140 of the first embodiment. If not otherwise stated, principles of the receive coil unit 140 of the first embodiment also apply to the receive coil unit 140 of the fifth embodiment.

The receive coil unit 140 of the fifth embodiment is shown in FIG. 6 by way of example with three antenna units 144. ADCs 156, de-noising units 152 and further signal processing components are for reasons of simplicity not shown in FIG. 6.

Each antenna unit 144 of the fifth embodiment comprises a coil element 146, a local RF screen 158 and an E-field antenna 148. The E-field antenna 148 is coupled via a coupling element 162, which is an inductivity in this embodiment, to the local RF screen 158. To optimize impedance match and noise pick-up, lumped element components are combined with the E-field antenna 148.

Figure 7:
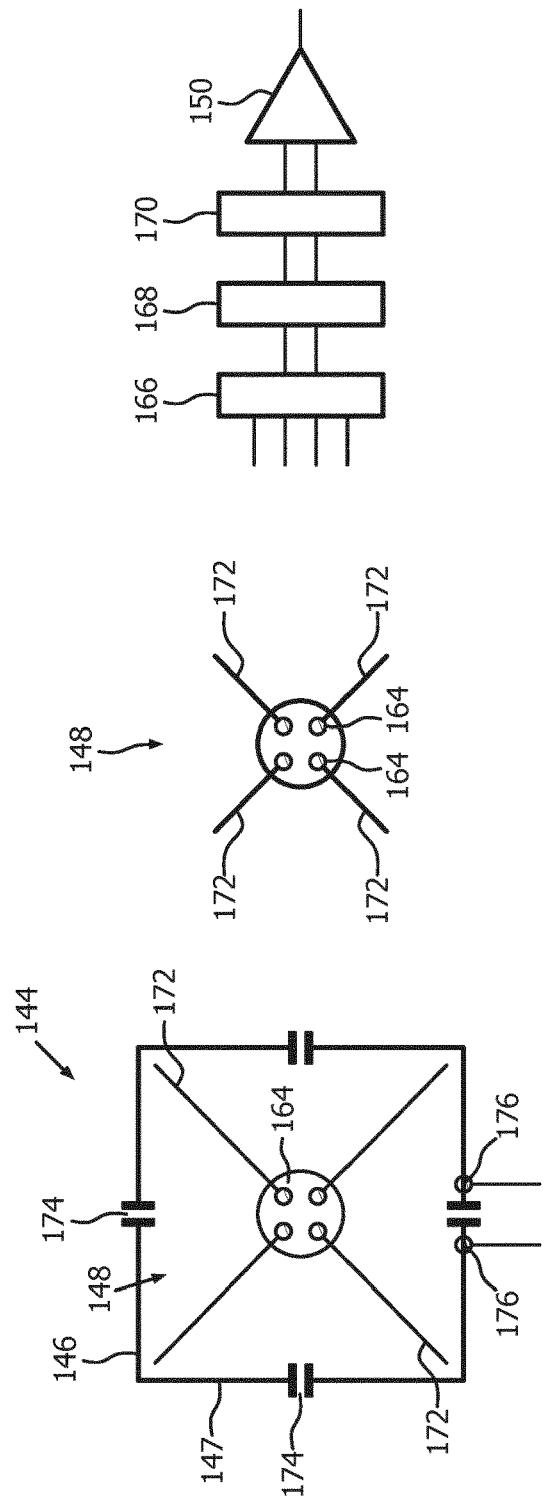
FIG. 7 is a schematic illustration of an antenna unit of any of the above receive coil units according to a sixth embodiment.

FIG. 7 refers to an antenna unit 144 according to a sixth embodiment. The antenna unit 144 of the sixth embodiment can substitute any of the previously described antenna units 144. If not otherwise stated, principles of the antenna units 144 of the first to fifth embodiment also apply to the antenna unit 144 of the sixth embodiment.

The antenna unit 144 according to the sixth embodiment comprises a coil element 146 sensitive to magnetic resonance signals, i.e. sensitive to B-field signals, and an E-field antenna 148 sensitive to E-field signals. The E-field antenna 148 and the coil element 146 are decoupled, as described above.

As can be seen in FIG. 7, the coil element 146 is provided as an essentially planar loop 147, and the E-field antenna 148 is embedded in the coil element 146. As can be further seen in FIG. 7, the E-field antenna 148 is located in the plane of the coil element 146 and within the coil element 146. In an alternative embodiment, the E-field antenna 148 is oriented at some angle with respect to the coil element 146.

The E-field antenna 148 of the sixth embodiment is provided as orthogonal dipole antenna with four connections 164. In this embodiment, the connections 164 are connected via a diversity switch 166, balun filter 168, and impedance matching unit 170 to pre-amplifier 150. The diversity switch 166 provides an optimum receive pattern of individual segments 172 of the E-field antenna 148. The coil element 146 is provided with coupling capacitors 174 within the planar loop 147. Furthermore, the coil element 146 is provided with connections 176, which are connected to a pre-amplifier 150 in accordance with the description of the first embodiment.

ADCs 156, de-noising units 152 and further signal processing components of the antenna unit 144 are for reasons of simplicity not shown in FIG. 7.

FIG. 8 refers to an antenna unit 144 according to a seventh embodiment. The antenna unit 144 of the seventh embodiment can substitute any of the previously described antenna units 144. If not otherwise stated, principles of the antenna units 144 of the first to sixth embodiment also apply to the antenna unit 144 of the seventh embodiment.

The antenna unit 144 according to the seventh embodiment comprises a coil element 146 sensitive to magnetic resonance signals, i.e. sensitive to B-field signals, and an E-field antenna 148 sensitive to E-field signals. The E-field antenna 148 and the coil element 146 are decoupled, as described above.

As can be seen in FIG. 8, the coil element 146 is provided as an essentially planar loop 147, and the E-field antenna 148 is embedded in the coil element 146. As can be further seen in FIG. 8, the E-field antenna 148 is located in the plane of the coil element 146 and within the coil element 146. In an alternative embodiment, the E-field antenna 148 is oriented at some angle with respect to the coil element 146.

The E-field antenna 148 of the seventh embodiment is provided as dipole antenna with two connections 164, which are connected via balun filter 168 and impedance matching unit 170 to pre-amplifier 150. The coil element 146 is provided with coupling capacitors 174 within the planar loop 147. Furthermore, the coil element 146 is provided with connections 176, which are connected to a preamplifier in accordance with the description of the first embodiment. The E-field antenna 148 in this embodiment is symmetrically matched using the balun filter. The impedance matching unit 170 transforms the impedance to the optimum noise impedance of the pre-amplifier 150.

ADCs 156, de-noising units 152 and further signal processing components of the antenna unit 144 are for reasons of simplicity not shown in FIG. 8.

FIG. 9 shows an antenna unit 144 according to an eighth embodiment. The antenna unit 144 of the eighth embodiment can substitute any of the previously described antenna units 144. If not otherwise stated, principles of the antenna units 144 of the first to seventh embodiment also apply to the antenna unit 144 of the eighth embodiment.

The antenna unit 144 according to the eighth embodiment comprises a coil element 146 sensitive to magnetic resonance signals, i.e. sensitive to B-field signals, and an E-field antenna 148 sensitive to E-field signals. The E-field antenna 148 and the coil element 146 are decoupled, as described above.

As can be seen in FIG. 9, the coil element 146 is provided as an essentially planar loop 147, and the E-field antenna 148 is embedded in the coil element 146. As can be further seen in FIG. 9, the E-field antenna 148 is located in the plane of the coil element 146 and within the coil element 146. In an alternative embodiment, the E-field antenna 148 is oriented at some angle with respect to the coil element 146.

The E-field antenna 148 of the eighth embodiment is provided as dipole stripline antenna with two connections 164. The coil element 146 is provided with coupling capacitors 174 within the planar loop 147. Furthermore, the coil element 146 is provided with connections 176, which are connected to a preamplifier in accordance with the description of the first embodiment. To achieve a locally optimal dipole antenna, the conducting dipole antenna is embedded inside a ceramic substrate with high permittivity.

ADCs 156, pre-amplifiers 150, de-noising units 152 and further signal processing components of the antenna unit 144 are for reasons of simplicity not shown in FIG. 9.

FIG. 10 shows an antenna unit 144 according to a ninth embodiment. The antenna unit 144 of the ninth embodiment can substitute any of the previously described antenna units 144. If not otherwise stated, principles of the antenna units 144 of the first to eighth embodiment also apply to the antenna unit 144 of the ninth embodiment.

The antenna unit 144 according to the ninth embodiment comprises a coil element 146 sensitive to magnetic resonance signals, i.e. sensitive to B-field signals, and an E-field antenna 148 sensitive to E-field signals. The E-field antenna 148 and the coil element 146 are decoupled, as described above.

As can be seen in FIG. 10, the coil element 146 is provided as a TEM coil element, which is coupled using coupling capacitors 174 to a local RF screen 158 of the antenna unit 144. The local RF screen 158 in this embodiment is provided as a circumferential screen in the receive coil unit 140. The E-field antenna 148 is embedded radially between the TEM coil element and the local RF screen 158. The E-field antenna 148 is provided with connections 164, which extend through the local RF screen 158. Also feeding of the TEM coil element is provided in a way not shown through the local RF screen 158.

ADCs 156, pre-amplifiers 150, de-noising units 152 and further signal processing components of the antenna unit 144 are for reasons of simplicity not shown in FIG. 10.

Figure 11:
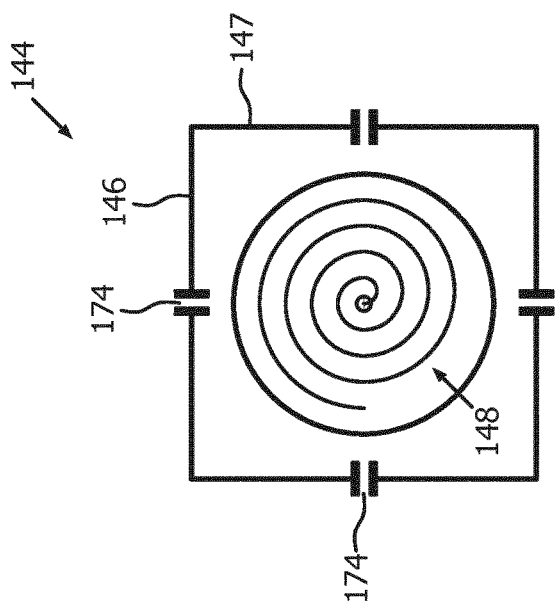
FIG. 11 is a schematic illustration of an antenna unit according to a tenth embodiment.

FIG. 11 shows an antenna unit 144 according to a tenth embodiment. The antenna unit 144 of the tenth embodiment can substitute any of the previously described antenna units 144. If not otherwise stated, principles of the antenna units 144 of the first to ninth embodiment also apply to the antenna unit 144 of the tenth embodiment.

The antenna unit 144 according to the tenth embodiment comprises a coil element 146 sensitive to magnetic resonance signals, i.e. sensitive to B-field signals, and an E-field antenna 148 sensitive to E-field signals. The E-field antenna 148 and the coil element 146 are decoupled, as described above.

As can be seen in FIG. 11, the coil element 146 is provided as an essentially planar loop 147, and the E-field antenna 148 is embedded in the coil element 146. As can be further seen in FIG. 11, the E-field antenna 148 is located in the plane of the coil element 146 and within the coil element 146. In an alternative embodiment, the E-field antenna 148 is oriented at some angle with respect to the coil element 146.

The E-field antenna 148 of the tenth embodiment is provided as a spiral pick-up antenna. The coil element 146 is provided with coupling capacitors 174 within the planar loop 147. To reduce the size of the spiral pick-up antenna, the spiral pick-up antenna is mounted on a ceramic substrate with a high dielectric constant.

ADCs 156, pre-amplifiers 150, de-noising units 152 and further signal processing components of the antenna unit 144 are for reasons of simplicity not shown in FIG. 11.

Figure 12:
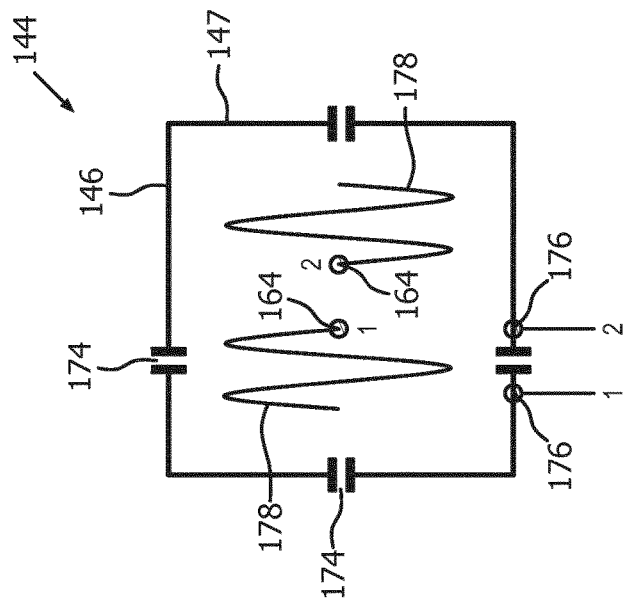
FIG. 12 is a schematic illustration of an antenna unit according to a eleventh embodiment.

FIG. 12 shows an antenna unit 144 according to an eleventh embodiment. The antenna unit 144 of the eleventh embodiment can substitute any of the previously described antenna units 144. If not otherwise stated, principles of the antenna units 144 of the first to tenth embodiment also apply to the antenna unit 144 of the eleventh embodiment.

The antenna unit 144 according to the eleventh embodiment comprises a coil element 146 sensitive to magnetic resonance signals, i.e. sensitive to B-field signals, and an E-field antenna 148 sensitive to E-field signals. The E-field antenna 148 and the coil element 146 are decoupled, as described above.

As can be seen in FIG. 12, the coil element 146 is provided as an essentially planar loop 147, and the E-field antenna 148 is embedded in the coil element 146. As can be further seen in FIG. 12, the E-field antenna 148 is located in the plane of the coil element 146 and within the coil element 146. In an alternative embodiment, the E-field antenna 148 is oriented at some angle with respect to the coil element 146.

The E-field antenna 148 of the eleventh embodiment is provided as a dipole antenna with two connections 164. The coil element 146 is provided with coupling capacitors 174 within the planar loop 147. Furthermore, the coil element 146 is provided with connections 176 for connection to a preamplifier in accordance with the description of the first embodiment. The E-field antenna 148 of the eleventh embodiment comprises wires 178, which are wound on a planar surface.

ADCs 156, pre-amplifiers 150, de-noising units 152 and further signal processing components of the antenna unit 144 are for reasons of simplicity not shown in FIG. 12.

Figure 13:
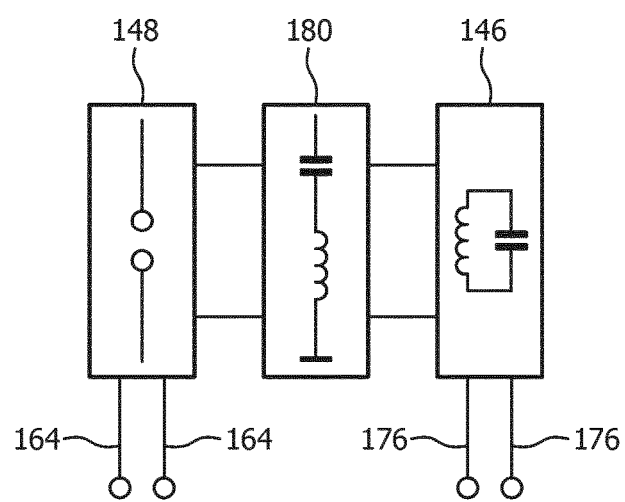
FIG. 13 is a schematic illustration of an antenna unit according to a twelfth embodiment.

FIG. 13 shows an antenna unit 144 according to a twelfth embodiment. The antenna unit 144 of the twelfth embodiment can substitute any of the previously described antenna units 144. If not otherwise stated, principles of the antenna units 144 of the first to eleventh embodiment also apply to the antenna unit 144 of the twelfth embodiment.

The antenna unit 144 according to the twelfth embodiment comprises a coil element 146 sensitive to magnetic resonance signals, i.e. sensitive to B-field signals, and an E-field antenna 148 sensitive to E-field signals. The E-field antenna 148 and the coil element 146 are decoupled, as described above.

The E-field antenna 148 of the twelfth embodiment is provided as a dipole antenna with two connections 164. The coil element 146 is provided with connections 176 for connection to a preamplifier in accordance with the description of the first embodiment. As can be seen in FIG. 13, the coil element 146 and the E-field antenna 148 are decoupled by a decoupling circuit 180.

ADCs 156, pre-amplifiers 150, de-noising units 152 and further signal processing components of the antenna unit 144 are for reasons of simplicity not shown in FIG. 12.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST

110 magnetic resonance (MR) imaging system
112 magnetic resonance (MR) scanner
114 main magnet
116 RF examination space, bore
118 center axis
120 subject of interest
122 magnetic gradient coil system
124 RF screen
126 MR imaging system control unit
128 monitor unit
130 MR image reconstruction unit
132 control line
134 RF transmitter unit
136 RF switching unit
138 control line 140 radio frequency (RF) antenna device, receive coil unit
142 receive coil array
144 antenna unit
146 coil element
147 planar loop
148 E-field antenna
150 pre-amplifier
152 de-noising unit
154 optical output
156 analog-to-digital converter, ADC
158 local RF screen
160 cover
162 coupling element, inductivity
164 connection (E-field antenna)
166 diversity switch
168 balun filter
170 impedance matching unit
172 segment
174 coupling capacitor
176 connection (coil element)
178 wire
180 decoupling circuit

The invention claimed is:

1. A receive coil unit comprising:
a receive coil array for use in a magnetic resonance imaging system with multiple antenna units sensitive to magnetic resonance signals, wherein each antenna unit includes a coil element sensitive to B-field signals, and
each antenna unit includes an E-field antenna sensitive to E-field signals and wherein the E-field antenna is embedded in the coil element-for each antenna unit, and
multiple de-noising units for filtering noise signals as received from the E-field antennas from the B-field signals received from the respective coil element, wherein one de-noising unit is associated to each antenna unit, and each de-noising unit is adapted to perform de-noising based on the E-field signals of the E-field antennas of the respective antenna unit.

2. The receive coil unit according to claim 1, wherein the receive coil unit comprises one de-noising unit for filtering noise signals as received from the E-field antenna from the B-field signals received from the respective coil element, whereby the de-noising unit is connected to multiple antenna units, and the de-noising unit is adapted to perform de-noising for each connected antenna unit based on the E-field signals of the E-field antennas of the connected antenna units.

3. The receive coil unit according to claim 1, wherein the de-noising unit is adapted to perform de-noising based on antiphase operation and/or based on an independent component analysis.

4. The receive coil unit according to claim 1, wherein at least one analog-to-digital converter is provided for converting analog signals from the antenna unit into digital signals fed to the de-noising unit.

5. The receive coil unit-according to claim 1, wherein the coil element is provided as an essentially planar loop, and the E-field antenna is located in the plane of the coil element as defined by the planar loop.

6. The receive coil unit according to claim 1, wherein the E-field antenna of each antenna unit is connected via at least one of a diversity switch, a balun, an impedance matching unit or a pre-amplifier to the respective de-noising unit.

7. The receive coil unit according to claim 1, wherein the antenna unit comprises local RF screen, and the E-field antennas of the antenna units are connected to the local RF screen.

8. The receive coil unit according to claim 1, wherein the receive coil unit comprises a RF screen, which is provided as a circumferential screen in the receive coil unit or as a circumferential outer surface thereof,
the coil element is provided as a TEM coil element, which is coupled to the RF screen, and
the coil element, the E-field antenna and the RF screen are arranged in this order in a direction radially outward of the receive coil unit.

9. A magnetic resonance imaging system comprising a receive coil unit with a receive coil array having multiple antenna units sensitive to magnetic resonance signals, i.e. antenna units sensitive to B-field signals, wherein the receive coil unit is provided as a receive coil unit according to claim 1.

10. The magnetic resonance imaging system according to claim 9, wherein
the magnetic resonance imaging system comprises a de-noising unit for filtering noise signals as received from the E-field antenna from the B-field signals received from the respective coil element, whereby the de-noising unit is connected to multiple antenna units of the receive coil unit, and
the de-noising unit is adapted to perform de-noising for each connected antenna unit based on the E-field signals of the E-field antennas of the connected antenna units.

11. A method for magnetic resonance imaging comprising the steps of:
providing a receive coil unit comprising a receive coil array for use in a magnetic resonance imaging system with multiple antenna units sensitive to magnetic resonance signals, i.e. antenna units sensitive to B-field signals, whereby each antenna unit comprises a coil element sensitive to B-field signals, and each antenna unit comprises an E-field antenna sensitive to E-field signals, wherein the E-field antenna is embedded in the coil element for each antenna unit and performing de-noising of the B-field signals received from the coil elements of the receive coil unit by filtering noise signals, as received from the E-field antenna, from the B-field signals.

12. A software package for upgrading a MR imaging system, whereby the software package contains instructions stored on a non-transistory computer readable medium for controlling the MR imaging system according to the method of method claim 11.

13. A receive coil unit comprising:
a receive coil array for use in a magnetic resonance imaging system with multiple antenna units sensitive to magnetic resonance signals, wherein each antenna unit includes a coil element sensitive to B-field signals,
each antenna unit includes an E-field antenna sensitive to E-field signals and wherein the E-field antenna is embedded in the coil element for each antenna unit,
wherein at least one analog-to-digital converter is provided for converting analog signals from the antenna unit into digital signals fed to a de-noising unit.

14. The receive coil unit according to claim 13, wherein the de-noising unit is adapted to perform de-noising based on antiphase operation and/or based on an independent component analysis.

15. The receive coil unit according to claim 13, wherein at least one analog-to-digital converter is provided for converting analog signals from the antenna unit into digital signals fed to the de-noising unit.

16. The receive coil unit according to claim 13, wherein the coil element is provided as an essentially planar loop, and the E-field antenna is located in the plane of the coil element as defined by the planar loop.

17. The receive coil unit according to claim 13, wherein the E-field antenna of each antenna unit is connected via at least one of a diversity switch, a balun, an impedance matching unit or a pre-amplifier to the respective de-noising unit.

18. The receive coil unit according to claim 13, wherein the antenna unit comprises a local RF screen, and the E-field antennas of the antenna units are connected to the local RF screen.

19. The receive coil unit according to claim 13, wherein the receive coil unit comprises a RF screen, which is provided as a circumferential screen in the receive coil unit or as a circumferential outer surface thereof,
- the coil element is provided as a TEM coil element, which is coupled to the RF screen, and
- the coil element, the E-field antenna and the RF screen are arranged in this order in a direction radially outward of the receive coil unit.

* * * * *